United States Patent

Chen

[11] Patent Number: 5,814,853
[45] Date of Patent: Sep. 29, 1998

[54] SOURCELESS FLOATING GATE MEMORY DEVICE AND METHOD OF STORING DATA

[75] Inventor: Jian Chen, San Jose, Calif.

[73] Assignee: Advanced Micro Devices, Inc., Sunnyvale, Calif.

[21] Appl. No.: 589,750

[22] Filed: Jan. 22, 1996

[51] Int. Cl.⁶ .................................................. H01L 29/788
[52] U.S. Cl. .......................... 257/315; 257/317; 257/318; 257/321; 257/322; 365/175; 365/177; 365/182; 365/184
[58] Field of Search ...................................... 257/315, 322, 257/314, 318, 321, 317; 365/175, 177, 182, 184

[56] References Cited

U.S. PATENT DOCUMENTS

| | | | |
|---|---|---|---|
| 3,919,711 | 11/1975 | Chou | 257/322 X |
| 4,432,075 | 2/1984 | Eitan | 365/185 |
| 4,866,493 | 9/1989 | Arima et al. | 257/318 |
| 4,920,513 | 4/1990 | Takeshita et al. | 365/175 |
| 4,953,928 | 9/1990 | Anderson et al. | 257/321 |
| 5,402,371 | 3/1995 | Ono | 257/315 X |
| 5,434,813 | 7/1995 | Tamura et al. | 257/317 X |
| 5,457,652 | 10/1995 | Brahmbhatt | 257/314 X |
| 5,483,484 | 1/1996 | Endoh et al. | 257/322 X |
| 5,502,668 | 3/1996 | Shimoji et al. | 257/317 X |
| 5,559,735 | 9/1996 | Ono et al. | 257/315 X |

FOREIGN PATENT DOCUMENTS

| | | |
|---|---|---|
| 0 056 195 A2 | 7/1982 | European Pat. Off. . |
| 0 590 319 A2 | 4/1994 | European Pat. Off. . |
| A 57-152164 | 12/1982 | Japan . |
| 363244686 | 10/1988 | Japan ........ 257/317 |

OTHER PUBLICATIONS

Fowler, "Switchable Diode with Control Electrode", *IBM Technical Disclosure Bulletin*, vol. 16, No. 3, Aug. 1973, pp. 870–871.

Jian Chen, et al., *Subbreakdown Drain Leakage Current in MOSFET*, IEEE Electron Device Lett.,l vol. EDL–8, No. 11, pp. 515–517, Nov. 1987.

T.Y. Chan, *The Impact of Gate–Induced Drain Leakage Current on MOSFET Scaling*, IEDM Technical Digest, pp. 718–721, 1987.

Chi Chang, et al., *Corner–Field Induced Drain Leakage In Thin Oxide MOSFETS*, IEDM Technical Digest, pp. 714–717, 1987.

*Primary Examiner*—William Mintel
*Attorney, Agent, or Firm*—Fliesler, Dubb, Meyer & Lovejoy LLP

[57] ABSTRACT

A floating gate diode which can be used as a sourceless memory cell, and which may be arranged into an array of memory cells is disclosed. The floating gate diode comprises: a drain region formed in a substrate; an oxide overlying and associated with the drain region; and a floating gate overlying the oxide. Upon application of a voltage to the drain, a current between the drain and substrate is induced in proportion to an amount of electrons stored on the gate. The cells may be arranged into an array which comprises a substrate having a surface; a plurality of drain regions, one of said drain regions respectively corresponding to one of the plurality of cells, formed in the substrate; an oxide region overlying the plurality of drain regions on the surface of the substrate; and a plurality of floating gates overlying the oxide and respectively associated with the plurality of drain regions.

12 Claims, 6 Drawing Sheets

Band to band tunneling current as read current.

SOURCELESS FLOATING GATE MEMORY DEVICE AND METHOD OF STORING DATA

BACKGROUND OF THE INVENTION

1. Field of the Invention

The invention relates to non-volatile memory apparatus and methods for storing data.

2. Description of the Related Art

Nonvolatile semiconductor memory devices have traditionally been based on floating gate transistors. Each floating gate transistor stores a bit of data, and a plurality of floating gate transistors are arranged in an array, organized into rows and columns (also known as word lines and bit lines, respectively). The floating gate transistor array, also referred to as the "core" of the memory device, is controlled by peripheral devices such as sense amplifiers and select transistors. Together, the core cells and peripheral devices make up a memory device.

The essence of nonvolatile semiconductor memory is that charge stored on the floating gate introduces a vertical field, which modifies the electrical current one is able to read from the drain node on the bit line. One thing all floating gate devices have in common is that they all involve the principle of using a transistor. Charge (in the form of electrons) is stored on the floating gate to indicate the presence or absence of a binary bit of data. The trapped charge raises the threshold voltage of the transistor, and the transistor is "OFF", or "0". During a read of the cell, one will either read a current or no current, depending on the state of the channel of the transistor as affected by the charge or lack of charge on the floating gate. In the case of the transistor, the channel between the source and drain is either turned ON or OFF.

If floating gate transistors are used in a read-only configuration, they are referred to as read only memory (ROM). Erasable Programmable ROM (EPROM) comprises memory which one can write data to and can erase by exposure to ultraviolet UV radiation. So-called "flash" memory comprises Electrically Erasable Programmable PROM (EEPROM), wherein one can both write data to the cells and electrically erase the cells (either as an entire chip or sector thereof, or in a page erase mode).

The general structure of an EEPROM floating gate device is shown in FIGS. 1A and 1B. As shown therein, a silicon substrate 32 (in this embodiment a p-type silicon substrate), has formed therein an n+ source region 34 and an n+ drain region 36. A floating gate 38, generally comprised of deposited polysilicon or amorphous silicon, is shown overlying portions of source 34 and drain 36. A control gate 40 overlies floating gate 38. Two oxide regions 42, 44 separate control gate 40 from floating gate 38, and floating gate 38 from the surface of substrate 32, respectively. In most cells, floating gate 44 is comprised of polysilicon, although in some devices, floating gate 44 is comprised of nitrides or oxides which act as charge traps to retain electrons.

FIG. 2 shows a schematic representation of the individual cells 30 formed into an array 80, comprised of rows 52 and columns 54. The cells are controlled through column address logic 56 and row address logic 58.

Electrons are stored on floating gate in different ways, depending upon the type of device (ROM, EPROM, or Flash EEPROM). FIG. 1A shows how charge is added to a typical flash EEPROM cell through hot carrier injection. As shown therein, the control gate 40 is typically coupled to +10 volts, the source ($V_s$) to 0 volts, the drain ($V_d$) to 5 volts, and the substrate ($V_{sub}$) to 0 volts. As a result, a conductive region across the channel is established and electrons accelerated into this region. Electrons are raised sufficiently in potential to overcome the insulating property of gate layer 42.

FIG. 1B shows the voltages used to add charge to the typical flash EEPROM cell through Fowler-Nordheim tunneling by holding the potential of drain 36, source 34 and the substrate at 4 volts or 0 volts, and applying a pulse of approximately 10 volts to 18 volts to control gate 40 (depending upon whether the substrate region is a p-well or bulk silicon). Although not shown, in an EEPROM device a portion of the floating gate 38 is positioned above the tunnel dielectric closer to drain 36 than other regions of tunnel dielectric 44. The thin dielectric region coupled to the high voltage between the gate and drain produces Fowler-Nordheim tunneling of electrons into the floating gate 38.

FIG. 3 illustrates a typical discharge operation of an EEPROM floating gate device in flash memory, which results in significant drain, source, and substrate current due to an effect referred to as to band-to-band tunneling, resulting in a current in the gate-to-source overlap region. As should be readily understood, discharge of the floating gate is one of the two most fundamental operations for any non-volatile memory device. It should be further recognized that the action of discharging electrons from the floating gate can be an erase function, where charging the floating gate is equivalent to writing a data bit to the gate, or it could be a write function, where all the bits are charged and then selectively discharged to show data on the gate.

As shown in FIG. 3, in a typical discharge operation, the control gate is held at (−)10 volts, the source voltage is held at +4 volts, and the drain is left floating. This condition is typical for memory arrays such as that shown in FIG. 2 wherein the entire array is being discharged simultaneously.

FIG. 3 shows conditions under which the so-called "band-to-band" tunneling effect has been observed. The effect has been studied in several contexts to determine its effect on MOS transistors. In the case represented in FIG. 3, the desired effect of the voltages is to drive electrons toward collection at the source region (as shown in FIG. 3), while holes are collected in the substrate. A current has been found in MOSFETS at breakdown voltages much below what is usually considered the breakdown voltage of the device, typically in devices with thin oxides. See, Jian Chen, et al., *Subbreakdown Drain Leakage Current in MOSFET,* IEEE ELECTRON DEVICE LETT., vol. EDL-8, no. 11, pp. 515–517, November, 1987; T. Y. Chan, et al., *The Impact of Gate-Induced Drain Leakage Current on MOSFET Scaling,* IEDM TECHNICAL DIGEST, pp. 718–721, 1987; and Chi Chang, et al., *Corner-Field Induced Drain Leakage In Thin Oxide MOSFETS,* IEDM TECHNICAL DIGEST, pp. 714–717. 1987.

SUMMARY OF THE INVENTION

The invention briefly described comprises a non-volatile memory cell involving only one p-n junction per cell. In essence, the device comprises a floating gate diode, with only a drain, floating gate and, in one embodiment, a control gate.

The sourceless memory cell of the present invention consists of a polysilicon floating gate, and a gated-diode junction. The cell utilizes the operational principle of modulating the floating gate potential on the band-to-band tunneling current measured on the drain junction of the device. Where the memory cell's floating gate stores negative charge (electrons), a large band-to-band tunneling current can be read under certain applied bit line (drain) voltages.

When no charge is present on the floating gate, or positive charge (holes) are present on the floating gate, little or no band-to-band current is measured. One can therefore differentiate the "1" and "0" states.

Other embodiments of the concept can also be applied to ROM type applications where no floating gate is needed.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENTS

The invention provides a novel memory cell array and method of controlling the cell which uses band-to-band tunneling current as the read sensing current for a memory device. The present invention makes use of the realization on the part of the current inventor that all one needs to store a bit defining a "1" or "0" is to have a vertical field modulated current recognizable on the drain, and that a complete transistor is not required for this. As long as there is a current which can be modulated by the vertical field, one may use the modulation to distinguish data in the device. If that vertical field can be altered through the use of floating gate device, then a non-volatile memory device can be formed.

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

Figure 1A:
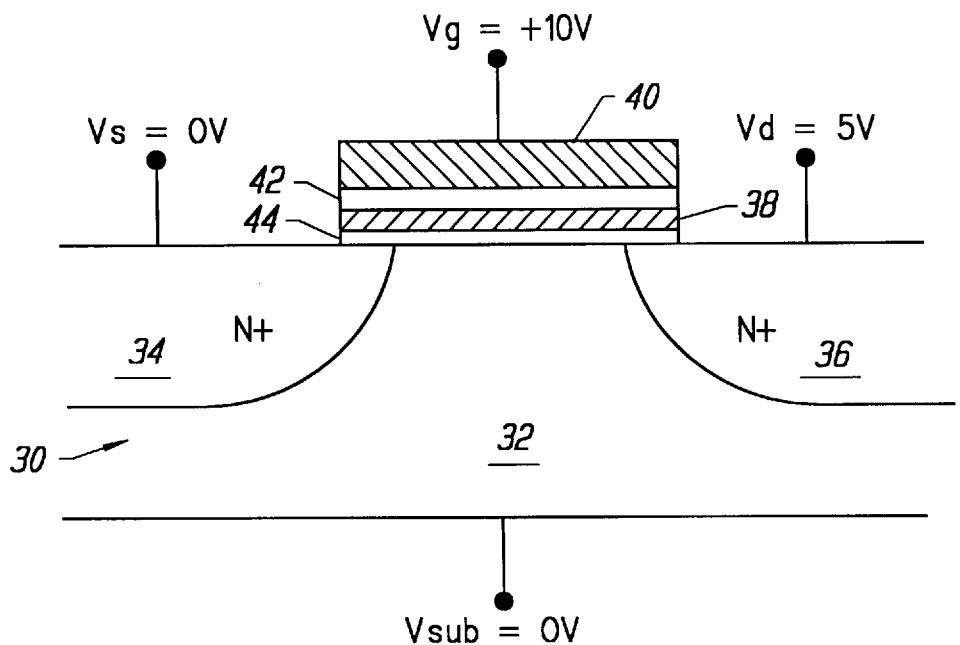
FIGS. 1A and 1B are cross-sections of a floating gate transistor showing the voltages coupled to the respective source drain and control gates of the transistor in a typical memory device.
Figure 1B:
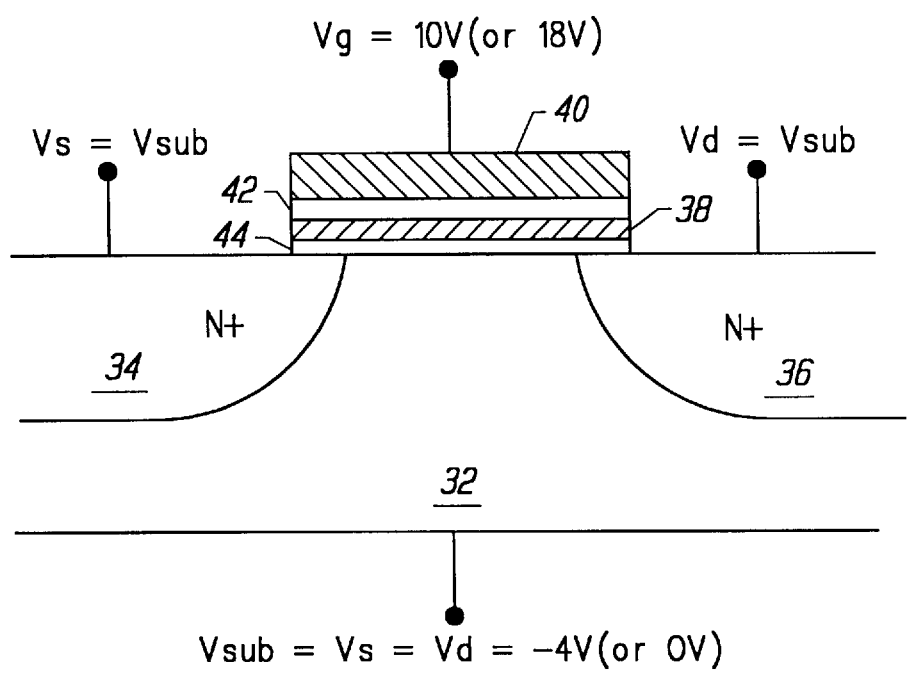
Figure 2:
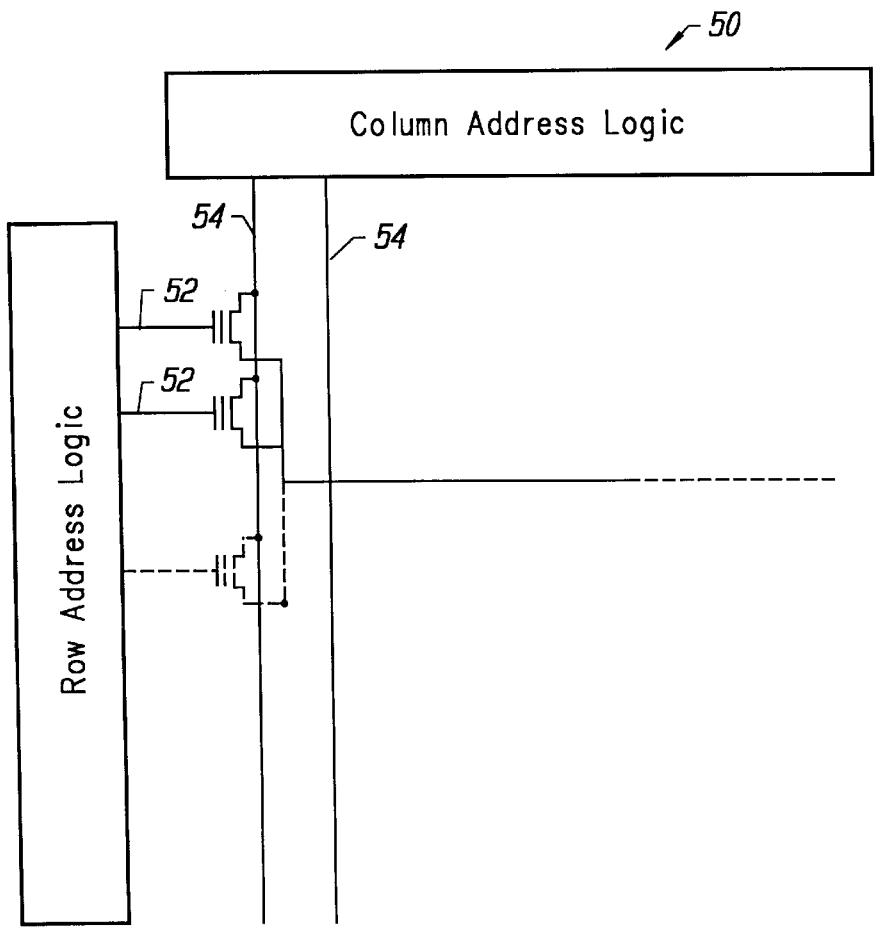
FIG. 2 is a schematic representation of a memory device incorporating a floating transistor such as that shown in FIGS. 1A and 1B.
Figure 3:
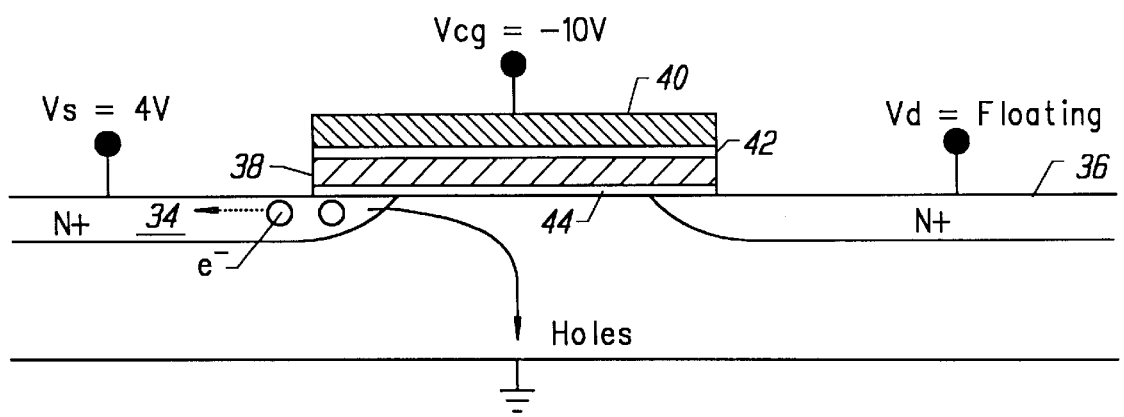
FIG. 3 is a cross-section of a floating gate transistor illustrating the band-to-band tunneling current.

As shown in FIG. 3, band-to-band tunneling current is flowing between the source junction node and the substrate coupled to ground. It is controlled by the gate voltage $V_{fg}$, or the vertical field. The fundamental of band-to-band tunneling is described by many publications, some of which include Jian Chen, et al., *Subbreakdown Drain Leakage Current in MOSFET,* IEEE ELECTRON DEVICE LETT., vol. EDL-8, no. 11, pp. 515–517, November, 1987; T. Y. Chan, et al., *The Impact of Gate-Induced Drain Leakage Current on MOSFET Scaling,* IEDM TECHNICAL DIGEST, pp. 718–721, 1987; and Chi Chang, et al., *Corner-Field Induced Drain Leakage In Thin Oxide MOSFETS,* IEDM TECHNICAL DIGEST, pp. 714–717, 1987. Most studies of band-to-band tunneling current are done using MOSFET transistors, but the mechanism is fundamentally a one-junction operation, independent of the other junction. (For example, in FIG. 3, the drain junction is floating and does not play any role in the band-to-band current.)

In a floating gate device, when the floating gate carries a negative charge (i.e., electrons), the floating gate potential becomes negative. When the floating gate is neutral, or charged with positive charge, then the floating gate potential is neutral or positive. As shown in FIG. 3, for the floating gate cell with a junction, and when a certain voltage $V_{d\_read}$ is applied to the junction, different amount of current can be read depending on the net charge on the floating gate. This fundamental principle led to the sourceless memory cell of the present invention.

Figure 4:
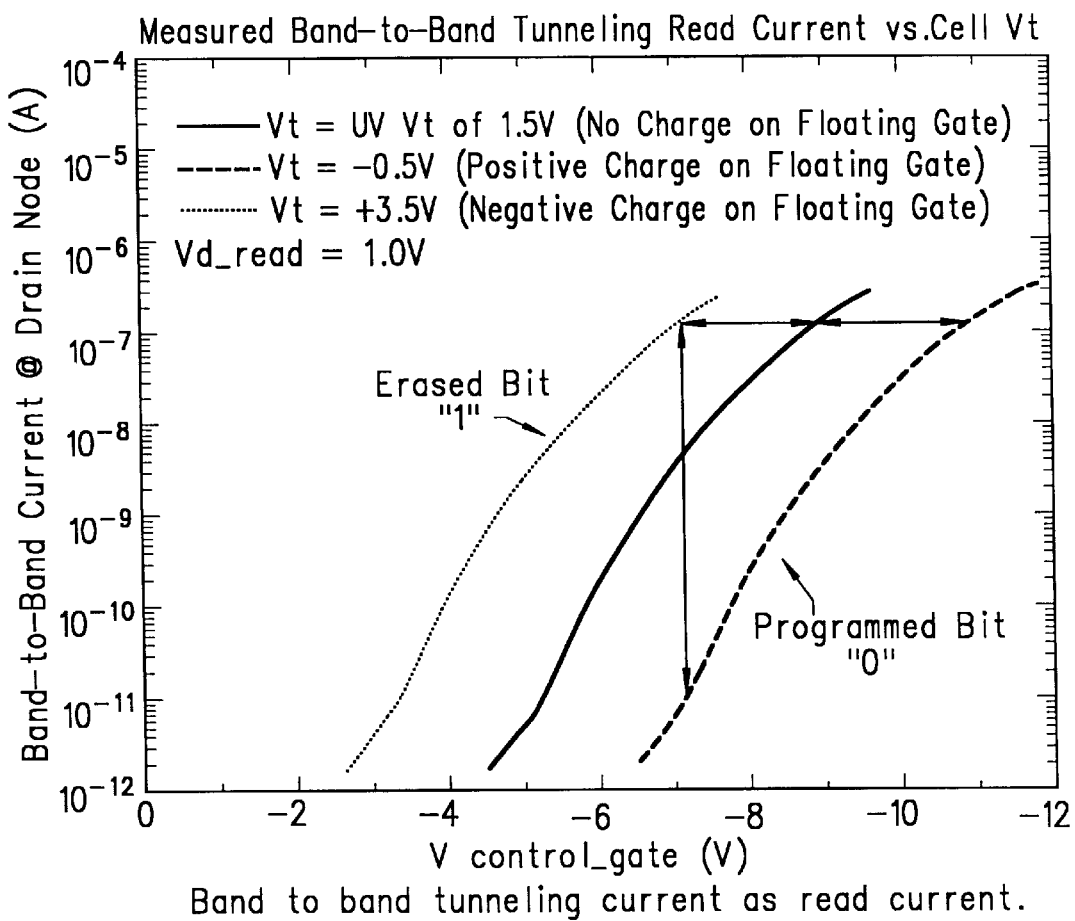
FIG. 4 is a graph representing the band-to-band tunneling current versus the threshold voltage of a particular floating gate transistor under varying floating gate charge.

Shown in FIG. 4 are the measured band-to-band tunneling current with $V_{d\_read}=1.0V$, as a function of control gate voltage $V_{control\_gate}$. The cell floating gate is charged to different amount of charge: neutral states, negative charge states of $V_t=3.5V$ and positive charge states of $V_t=-0.5V$. The definition of threshold voltage ($V_t$) is the same as in the traditional transistor sense, since they are measured on a floating gate transistor. However, during the read operation, only one junction is employed. Under the following conditions, one can read current differences of 4 orders of magnitude for cells charged to "1" states of 3.5V and "0" states of −0.5V. Given this difference, enough margin is present to serve as a basis for memory operation.

Figure 5:
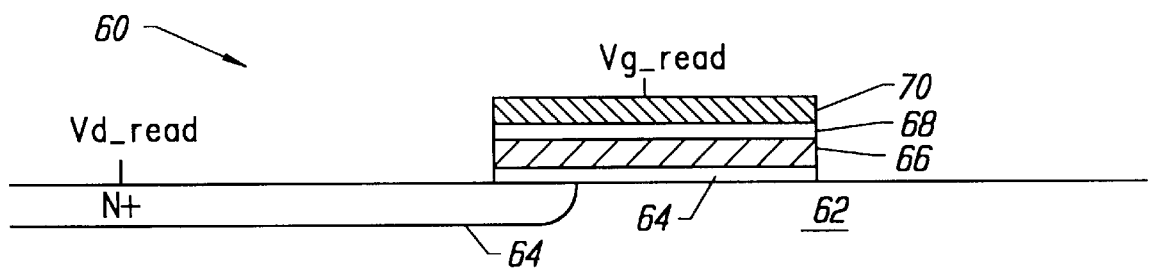
FIG. 5 is a cross-section of a memory cell in accordance with the present invention.

FIG. 5 shows a general, cross-sectional diagram of the memory cell formed in accordance with the present invention. Memory cell 60 will be formed in a semiconductor substrate 62 and have, for example, a drain region 64 formed below the surface 63 of substrate 62, a thin oxide layer 64 formed on the surface 63 of substrate 62, a floating gate region 66 formed over oxide 64, an interpoly dielectric layer 68 (such as oxynitride) and a control gate 70, formed of polysilicon, overlying interpoly dielectric layer 68. Note that variations on the memory cell shown in FIG. 5 are possible as will be apparent to one of average skill in the art, including, but not limited to, formation of lightly doped drain regions (not shown) and elimination of the floating gate 70, such that the word line is coupled directly to the floating gate. The memory cell of FIG. 5 can be formed in accordance with well-known techniques such as, for example, implantation of the drain regions using standard high dose doping techniques, thermal oxidation of substrate 62 to form oxide layer 64, deposition of polysilicon to form floating gate 66 and control gate 70, and thermal oxidation of the polysilicon layer forming floating gate 66 in a nitrogen atmosphere to form the interpoly dielectric layer (comprised of oxynitride) 68.

As will be apparent, the unique structure of memory cell 60 lies in the fact that no source region is shown. Programming and erasing of memory cell 60 is accomplished using the floating gate 70 and drain 64, and substrate voltage levels, as described below with respect to FIGS. 9 and 10.

Figure 6:
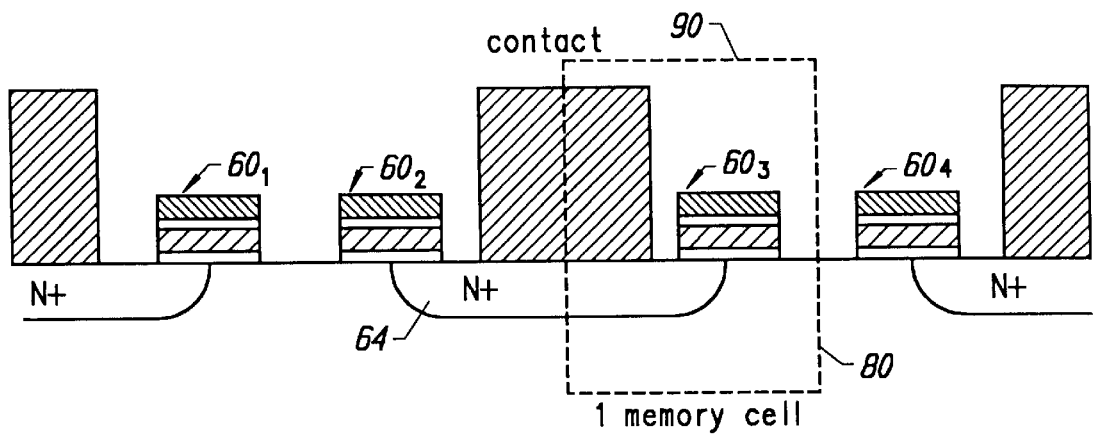
FIG. 6 is a cross-section of a memory array incorporating the memory cell in accordance with the present invention.
Figure 7A:
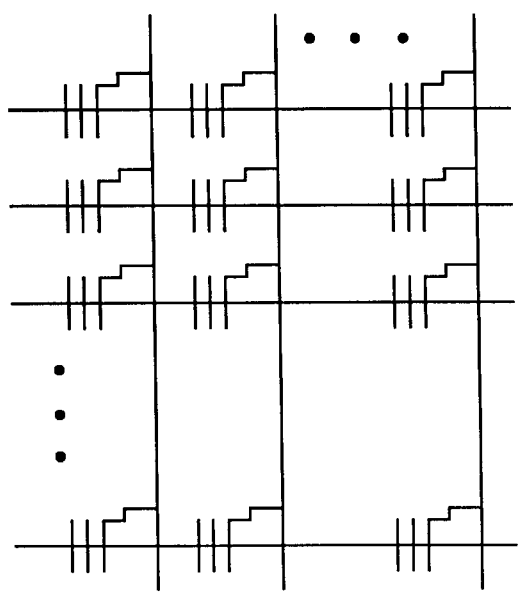
FIGS. 7A and 7B are schematic views of a memory cell array comprising a flash NOR or EPROM array (FIG. 7A) or a ROM array (FIG. 7B) utilizing the memory cells implemented in accordance with the present invention.
Figure 7B:
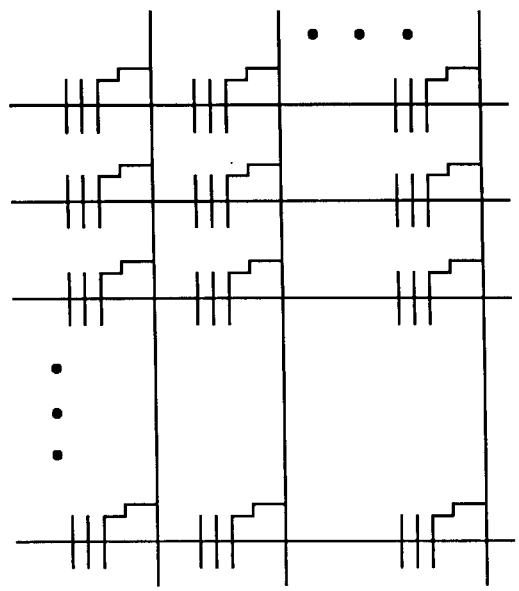

A cross-section of a semiconductor device embodying a number of unit cell structures $60_1$–$60_4$ similar to that shown in FIG. 5 is shown in FIG. 6. The unit cell is shown in dashed line box 80. A single interconnect line 90 can be used to access cells $60_2$, $60_3$, leading to scaling advantages in the use of the cell of the present invention. A schematic representation of how the memory cell of the present invention may be utilized in a NOR array format as a floating gate Flash memory is shown in FIG. 7A, while the corresponding Read-Only-Memory (ROM) format is shown in FIG. 7B.

Figure 8A:
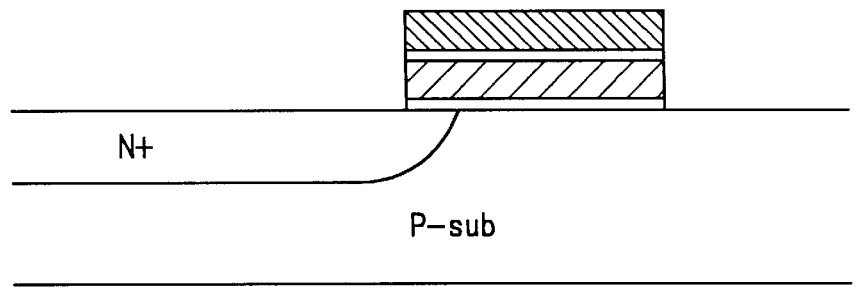
FIGS. 8A and 8B are cross-sections of memory cells formed in accordance with the present invention.
Figure 8B:
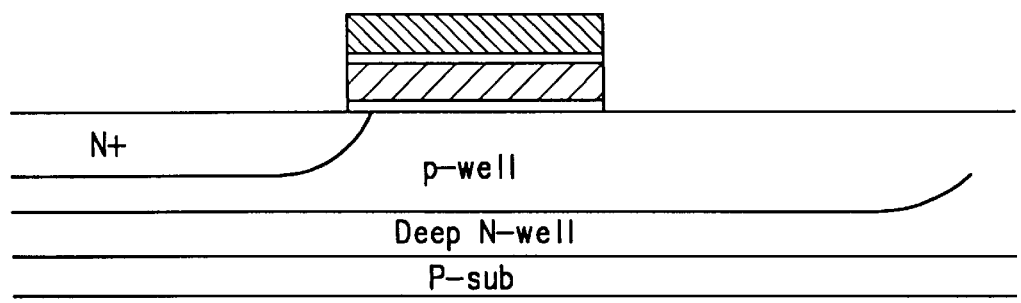

Various embodiments of the memory cell in accordance with the present invention are shown in FIGS. 8A and 8B. In the embodiment shown in FIG. 8A, substrate 62 is a p-type substrate. As shown in FIG. 8B, an alternative embodiment device 60 may be formed in a p-well inside an n-well. The embodiment of FIG. 8A is simpler, but higher gate voltage is required for charging. In the second case (FIG. 8B), part of the voltage could be applied to the p-well, therefore lower voltages could be used. It should be further recognized that the present cell may be formed in an n-type substrate or n-well in a p-type substrate.

The operation of a memory cell 60, formed in accordance with the present invention, is hereinafter described.

Figure 9:
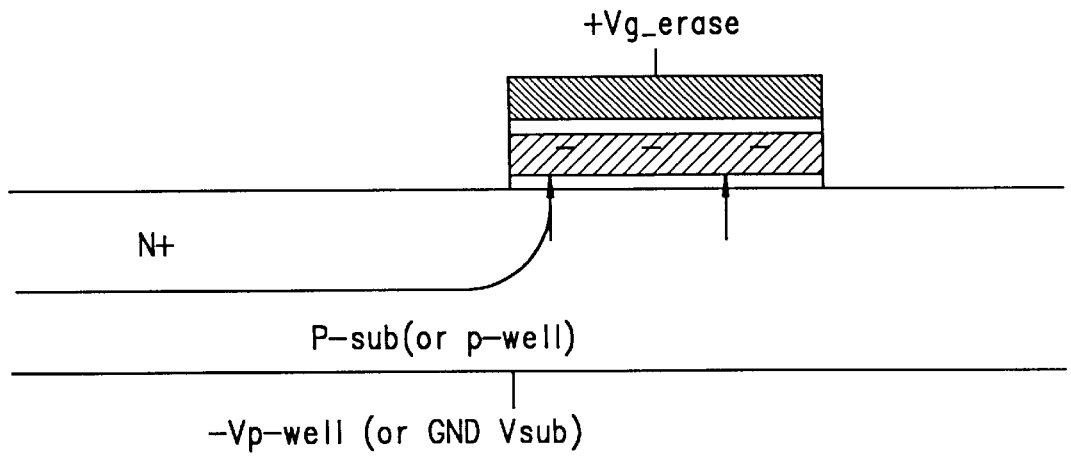
FIG. 9 is a cross-section of the memory cell of the present invention and the voltages coupled thereto during an erase separation.

FIG. 9 shows a typical erase (or charging) operation in the memory cell according to the present invention where the charge is stored on the gate. In this discussion, "erased" states are interpreted as floating gate charged states, indicating a binary "1". It should be recognized that, in an array, a "bulk charging" or "sector charging" operation can be performed to erase a sub-group of cells or all cells simultaneously. During erase, the substrate or p-well is applied with $V_{p\_well}$ (or GND if a p-type substrate), and the word lines (control gate) are biased with $+V_{g\_erase}$. In one embodiment, $V_{p\_well}$ and $V_{g\_erase}$ are on the order of –8V and +12V, respectively.

When the core cells are in a p-type substrate, a high $+V_g$ (in the neighborhood of +18 to +20V) is needed to charge up the floating gate. When the cells are formed in a p-well, the voltage is split between the gate and p-well, so a lower voltage on the control gate can be used. In both cases, charging of the floating gate occurs through channel F-N tunneling of electrons to the floating gate.

Figure 10:
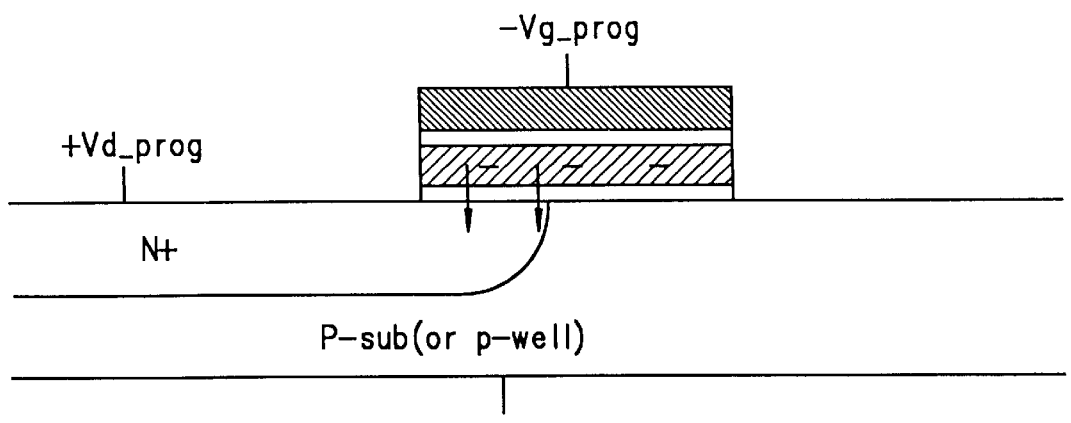
FIG. 10 is a cross-section of the memory cell of the present invention and the voltages coupled thereto during a charge operation.

In the aforementioned embodiment, programmed states are defined as "0", or the "discharged" cell state. Discharge is accomplished through junction edge F-N tunneling as shown in FIG. 10. During program, the selected bit line and voltage line voltages $V_{d\_prog}$ and $V_{g\_prog}$ are applied to the drain and control gate, respectively, and the selected bits are programmed (discharged). In one embodiment, $V_{d\_prog}$ and $V_{g\_prog}$ are on the order of +5V and –12V, respectively.

Figure 11:
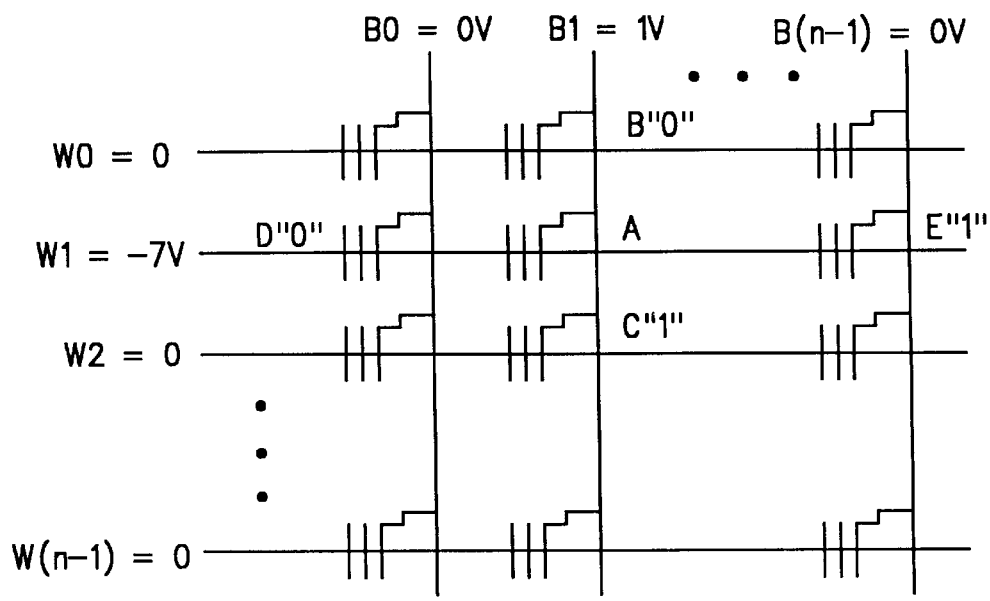
FIG. 11 is a schematic, top level view of a memory array formed using the memory cells of the present invention illustrating the effect of the read disturbance on adjacent cells.

The memory cell of the present invention allows a novel data read operation to be performed on the cell. Each bit cell in the device is either "selected" for a read or "unselected" (when not being read). The basic read characteristics of the selected read cell are shown in FIG. 11. In a "1" state (no charge on the floating gate), a read current will be detected, and a read gate voltage $V_{g\_read}$ of –7V. The example of read operation conditions for selected and unselected cells is as follows.

For the Selected Bit:
  Bit Line Read Voltage: $V_{d\_read}$=1.0V (for example)
  Word Line Read Voltage: $V_{g\_read}$=–7.0V (for example)
  If the bits are charged to "1" states, a read current of $I_{read}$ results; if the bits are discharged to "0" states, no read current results.

For the Un-Selected Bit:
  Bit Line Read Voltage: $V_{d\_read}$=0V
  Word Line Read Voltage: $V_{g\_read}$=0V
  No current is detected for all the bits with these bit line and word line voltages.

One issue which arises in the floating memory cell of the present invention is the so-called "read disturb" issue, which can arise between selected cells and adjacent cells with or without charge on the gate. When a read current is applied to the selected cell, adjacent, unselected cells showing the same bit line or word line can have the voltage on the floating gate affected by the voltages.

There are no disturb issues for ROM type of applications, since the programming of the cell with higher voltages is not required.

For Flash EPROM memory and EPROM applications, however, there are many different cell disturb conditions and cell disturb mechanisms. These can occur during programming (or discharge of the floating gate) erase (or charging of the floating gate), but usually occur during a "page" (or multiple cell) erase mode. Programming and erase cell disturb issues of this invention are identical to those found in other flash technologies and cell types, and are well addressed in the prior art. Of the most concern are the potential read disturb issues which may occur in the sourceless memory cell of the present invention.

Because the polarities of the control gate and bit voltages are the same during program and read operations, the more read current one applies to a cell, the more read disturb adjacent cells will experience. (This is true for hot electron types of cell programming also.) In addition, under the same voltage conditions, the faster one attempts to program the cell, the more read disturb one can expect.

There are four general cases of read disturb issues for adjacent cells, depending on the states and locations of the bit cells under consideration. They are shown in FIG. 11 and listed below. In each of the following examples, the disturbance of cell A is considered for voltages when selecting bit line B1 and word line W1 for cells B-E with the given charged or discharged states. Bit line B1 has a voltage of 1.0V and word line voltage of W1=–7V for the following cases. For this exemplary operational condition, the disturbed cells are as follows:

Case (1): Cell B shares bitline B1 with cell A and cell B has a "0" state (no electrons on floating gate). Under these conditions:

$$V_{WL}=0V, V_{fg}=0V+0.1\times1V=0.1V$$

(e.g.), no disturb possible

Case (2): Cell C shares bitline B1 with cell A, and has a "1" state (electrons on floating gate). Under these conditions:

$$V_{WL}=0V, V_{fg}=-0.5\times3V+0.1\times1V=-1.4V$$

(e.g.), little read disturb is present under this set of conditions

Case (3): Cell D shares wordline W1 with cell A, and cell D has a "0" state (no electrons) on its floating gate. Under these conditions:

$$V_{BL}=0V, V_{fg}=0-0.5 * 7=-3.5V$$

(e.g.), little read disturb possible

Case (4): Cell E shares wordline W1 with cell A, and has a "1" state (electrons on floating gate). Under these conditions:

$$V_{BL}=0V, V_{fg}=-0.5\times 3-0.5\times 7=-5.0V$$

(e.g.), this is the worst potential case read disturb condition

Out of the four possible cells potentially affected by read disturb issues, cell E, which shares the same word line as the selected read bit, and with a "1" state on its floating gate, has the most potential to be disturbed. The worst case read disturb bit has about 6V across the tunnel oxide region. The field set forth with respect to the worst case example is low enough that read disturb can be avoided. Compared with the conditions at program, where 5V is applied on the bit line (on the drain) and −12V on the wordline (control gate). The low disturb range provides enough margin to tolerate read disturb issues.

Figure 12:
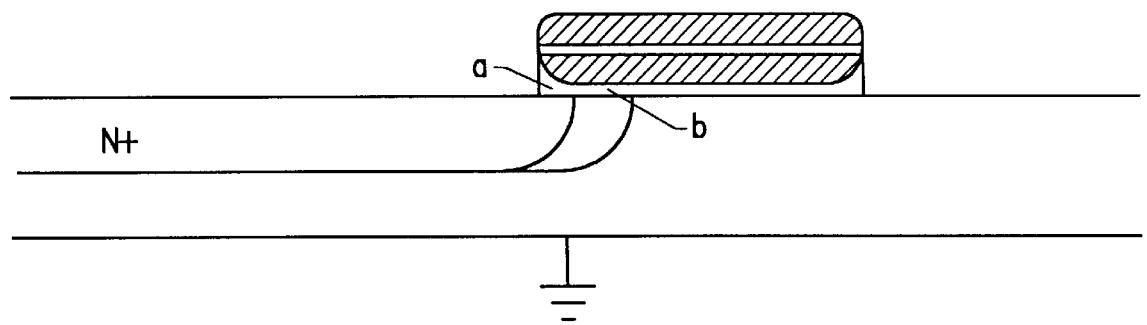
FIG. 12 is an alternative embodiment of the memory cell in accordance with the present invention.

Another alternative embodiment of the present invention includes altering the structure of the cell to control and reduce read disturb issues. It will, however, be recognized that this alternative presents a tradeoff at the expense of program speed for reducing read disturb. In this alternative, extra oxidation is performed after stacked gate (oxide, floating gate, interpoly dielectric and control gate) definition, and a device having the cross-sectional profile shown in FIG. 12 is obtained.

By oxidizing the floating gate edge of the gate-to-junction overlap area, the tunneling oxide thickness can be increased at the area where tunneling occurs, and where the junction has high doping concentration. This will reduce the tunneling current which causes the read disturb during cell read. However, the read current which is the band-to-band tunneling current will not be reduced if careful designing is exercised. This method can enhance the ratio of $I_{bb}/I_{gate}$, where $I_{bb}$ is the read current, and $I_{gate}$ is the program and disturb current.

The only drawback of this alternative embodiment is that programming speed will be reduced when using conventional programming voltages, requiring tolerance of the reduced speed or higher program voltages. (Because this is F-N tunneling, the programming current is not an issue.) This slow speed is due to the fact that the tunnel oxide has a "smile" at the gate edge due to oxidation of the floating gate polysilicon. During an erase of the cell, a drain voltage of about +5V and control gate voltage of about −10V is applied. Most Fowler-Nordheim tunneling erase current happens at closer to the end of point A in FIG. 12. At the point A, the thickening of tunnel oxide ends, and the drain junction has a high concentration to allow for F-N tunneling. When the doping concentration is high enough, the voltage drop in silicon is low and the oxide field is high. These two conditions produce the highest tunneling current field and current in the oxide. Band-to-band tunneling current happens further into the channel at "point B" in FIG. 12, where doping concentration is much lower due to the lightly doped drain ("LDD" or double-diffused implant) junction. The dopant concentration at this point provides the condition of band bending of more than 1.2V so band-to-band tunneling can happen. Because this is F-N programming, we can do page mode programming with a discharged gate as program gate.

There are several major advantages of the memory cell in accordance with the present invention. Since only one junction is needed per cell, the major scaling advantages are:
  no punchthrough-type short channel effects, one of the fundamental limitation of scaling;
  no need for ultra-shallow junctions in short channel devices, and
  no short channel induced degradation during discharge.

In addition, because only one junction is involved, any variation of gate length has little effect on device characteristics. In conventional transistor memory cells there is extreme channel length sensitivity to gate length. This eliminates another fundamental limitation on scaling resulting from the difficulty and cost associated with photolithography process.

Because only one junction is involved, gate-to-gate spacing can be extremely small, and is only limited by the gate etch process step. No complicated etch processes, such as the self-aligned source or "SAS" etch (described in U.S. Pat. Nos. 5,103,274 entitled "Self-Aligned Source Process and Apparatus" and 5,120,671 entitled "Process for Self-Aligning a Source Region With a Field Oxide Region and a Polysilicon Gate), are needed, and there are no $V_{ss}$ resistance problems.

The memory cell of the present invention is much smaller than the conventional memory cell, leading to much higher densities.

These advantages lead to cheaper and easier manufacturing of the cell.

It should be recognized that the principles of the memory cell of the present invention can be applied to multi-state storage. There is no fundamental difference in this regard to the conventional floating gate memory cell. In principle, the cell of the present invention can be used for multi-state storage. It can also used as analogy storage devices as well, especially considering its potential smaller read current compare with today's conventional NOR cells.

Thus a novel non-volatile memory cell involving only one p-n junction per cell improves substantially over the prior art, which typically comprise MOSFET transistors. The sourceless memory cell consists of a polysilicon floating gate, and a gated-diode junction. The modulation of floating gate potential on the band-to-band tunneling current measured on the drain junction allows storage of data in a manner which is superior to conventional transistor band memory. Where the cell is charged with negative charges (electrons), one can measure large band-to-band tunneling current with certain bit line (drain) voltage. When there is no charge on the floating or positive charge on the floating gate, one can only measure a band-to band current of very low value. One can therefore differentiate the "1"and "0" states. Different embodiments of the concept can also be applied like EPROM where no electrical erase is needed, or ROM type applications where no floating gate is needed.

What is claimed is:

1. A sourceless memory cell, comprising:
  a substrate having a surface;
  a drain region formed in the substrate;
  a first oxide overlying the drain region on the surface of the substrate;
  a first floating gate overlying the oxide;
  wherein data is stored in the cell by an addition or removal of a charge accumulation on the floating gate, such that upon application of a negative potential applied to the floating gate and a positive potential applied to the drain, a read current between the drain and substrate is induced in proportion to an amount of electrons stored on the gate.

2. The memory cell of claim 1 wherein the substrate is a p-type substrate.

3. The memory cell of claim 1 wherein the substrate includes an n-well, and the drain is formed in the n-well of the substrate.

4. The memory cell of claim 1 wherein the substrate is an n-type substrate.

5. The memory cell of claim 1 wherein the substrate includes a p-well, and the drain is formed in the p-well of the substrate.

6. The memory cell of claim 3 further including a second oxide region overlying the drain region, and a second floating gate overlying the second oxide and respectively associated with said drain region.

7. A memory array comprising a plurality of cells, the array comprising:

a substrate having a surface;

a plurality of drain regions, one of said drain regions respectively corresponding to one of the plurality of cells, formed in the substrate;

an oxide region overlying the plurality of drain regions on the surface of the substrate;

a plurality of floating gates overlying the oxide and respectively associated with the plurality of drain regions;

wherein data is stored on each of the plurality of cells by an addition or removal of a charge accumulation on each floating gate, such that upon application of a positive voltage to the drain, and a negative voltage to the floating gate a current between the drain and the substrate is induced in proportion to an amount of electrons stored on the gate.

8. The memory array of claim 7 wherein one of said plurality of drain regions and one of said plurality of oxide regions is respectively associated with two of said plurality of floating gates.

9. The memory array of claim 7 further including control means for applying a current to the drain and gate to determine whether charge is trapped on any one of said floating gates.

10. A memory cell, consisting of:

a drain region formed in a substrate;

a gate oxide on the substrate, the gate oxide having a thickness; and a floating gate comprised of a semiconductor material on the gate oxide, the floating gate having a first and a second end, wherein the semiconductor material is tapered at said first and second ends such that the thickness of the gate oxide at the ends of the floating gate is greater than at the middle of the gate.

11. The memory cell of claim 3 wherein a charged state of the cell varies from a threshold voltage range of about −0.5 volts to 3.5 volts, and the difference in said read current varies about 4 order of magnitude over said threshold voltage range.

12. The memory cell of claim 3 wherein the floating gate has first and second ends and wherein the floating gate is tapered at said first and second ends so that the thickness of the oxide at the ends of the gate is greater than at the middle of the gate.

* * * * *